United States Patent [19]

Eda et al.

[11] Patent Number: 5,387,888
[45] Date of Patent: Feb. 7, 1995

[54] HIGH FREQUENCY CERAMIC MULTI-LAYER SUBSTRATE

[75] Inventors: Kazuo Eda, Nara; Yutaka Taguchi, Settsu; Katsuyuki Miyauchi, Neyagawa, all of Japan

[73] Assignee: Matsushita Electric Industrial Co., Ltd., Osaka, Japan

[21] Appl. No.: 41,183

[22] Filed: Apr. 1, 1993

[30] Foreign Application Priority Data

Apr. 3, 1992 [JP] Japan .................................. 4-081815
Apr. 21, 1992 [JP] Japan .................................. 4-101177

[51] Int. Cl.$^6$ .............................................. H01P 1/15
[52] U.S. Cl. ........................................ 333/247; 257/664; 257/728
[58] Field of Search ........................ 333/247, 103, 104; 257/664, 728

[56] References Cited

U.S. PATENT DOCUMENTS

| | | | |
|---|---|---|---|
| 4,476,446 | 10/1984 | Blight | 333/32 |
| 4,875,087 | 10/1989 | Miyauchi et al. | 357/71 |
| 5,072,142 | 12/1991 | Tanino | 307/571 |
| 5,087,896 | 2/1992 | Wen et al. | 331/99 |
| 5,136,271 | 8/1992 | Nishioka | 333/246 |

FOREIGN PATENT DOCUMENTS

| | | |
|---|---|---|
| 0198698 | 10/1986 | European Pat. Off. . |
| 0444820 | 9/1991 | European Pat. Off. . |
| 0268301 | 11/1990 | Japan . |
| 3-25082 | 4/1991 | Japan . |
| 4-79601 | 3/1992 | Japan . |

OTHER PUBLICATIONS

"RF Front End Circuit Components Miniaturized Using Dielectric Resonators for Cellular Portable Telephones", Nishikawa, IEICE Transactions, vol. E 74, No. 6, Jun., 1991, pp. 1556–1562.
Microelectronics Journal vol. 16, Mar. 1985, Luton GB pp. 30–37, Gheewala "Packages for ultra-high speed GaAs ICs", *p. 31, paragraph 3.1; figue 1A*.

*Primary Examiner*—Robert J. Pascal
*Assistant Examiner*—Darius Gambino
*Attorney, Agent, or Firm*—Wenderoth, Lind & Ponack

[57] ABSTRACT

A high frequency ceramic multi-layer substrate includes a stripline embedded between two dielectric layers having ground electrodes at the top surface and at the bottom surface thereof and an electric circuit formed on another dielectric layer applied to one of the ground electrodes. The stripline is connected to the electric circuit through via holes provided through the dielectric layers. The equivalent length from the stripline to the electric circuit is a fourth of the wavelength of an input high frequency signal, to result in a high frequency attenuation circuit. Another high frequency ceramic multi-layer substrate further includes another electrode provided via another dielectric layer of larger dielectric constant to form a capacitor with one of the ground electrodes, and another dielectric layer for forming an electric circuit thereon is applied to the electrode. The stripline is connected to the electric circuit through via holes provided through dielectric layers. The electric circuit may be an impedance matching circuit of the stripline or a direct current bias circuit. This multi-layer structure makes the high frequency substrate compact and improves high frequency characteristics.

18 Claims, 4 Drawing Sheets

HIGH FREQUENCY CERAMIC MULTI-LAYER SUBSTRATE

BACKGROUND OF THE INVENTION

1. Field of the Invention

The present invention relates to the structure of a compact ceramic multi-layer substrate for dealing with high frequency signals.

2. Description of the Prior Art

Previously, there have been known monolithic substrates integrating active and passive elements on a semiconductor substrate and hybrid substrates integrating various active and passive elements on a dielectric layer such as alumina. In general, the hybrid substrate has a single layer structure. A multi-layer structure of electric circuits is also known for a dielectric substrate made of alumina or the like.

In the above-mentioned structure of a monolithic substrate, single layer structures are integrated. Therefore, if the sizes of electronics components to be integrated are determined, the total size can be determined depending on how the components are packed in the same plane. However, for a high frequency circuit, electromagnetic coupling exists through the space or the substrate. Therefore, it is difficult to integrate a circuit at a density more than a certain value.

Further, for a hybrid substrate, the structure may be made from multi-layers. However, only metallization is made from multi-layers, so that electronics components have been put on the surface. Therefore, this limits the integration and the compactness.

Further, in general, a high frequency circuit is liable to be coupled electromagnetically through a space. In order to prevent such coupling, various techniques such as a metallic shield plate arranged at the top are needed to shield the electromagnetic coupling. Then, high frequency characteristics may be damaged if the profile becomes complicated, if the size becomes large or if the shield is incomplete.

In order to solve these problems, various structures of ceramic multi-layer substrates have been proposed. For example, T. Nishikawa et al. proposed a compact high frequency filter circuit composed of passive components such as inductances (L) and capacitances (C) by using a multi-layer structure made from dielectric ceramics and electrodes (RF Front End Circuit Components Miniaturized Using Dielectric Resonators for Cellular Telephones, IEICE Transactions, Vol. E 74, No. 6, (1991), pp. 1556-1562). This structure is made from the same dielectric material. However, for a circuit such as a resonator including active elements for example transistors, it is not appropriate to use a first dielectric material of large dielectric constant on a substrate section wherein discrete components are set because a phase shift occurs at high frequencies. On the other hand, it is preferable that the dielectric constant of a second dielectric material for constructing the resonator is larger than that of the former dielectric material.

In order to solve this problem, for example, K. Hayashi discloses a structure wherein the dielectric constant of a first dielectric material for constructing a resonator is larger than that of a second dielectric material in a section for setting discrete components (Japanese Patent laid open Publication No. 79,601/1992). However, in a circuit including active components such as transistors, a capacitor of large capacitance such as a bypass capacitor is needed for a direct current bias circuit. Therefore, this structure is not sufficient for miniaturization. Further, in a circuit such as a high frequency amplifier, a path for direct current bias is connected to a high frequency transmission line. Then, if high frequency components pass the direct current bias circuit, unfavorable phenomena such as a loss or unstableness inducing oscillation may occur.

In a structure disclosed in Japanese Patent laid open Publication No. 25,082/1991, the diameter of a through-hole of a multi-layer substrate connected to an electrical conduction line for power supply is decreased or the length thereof is increased to increase an inductance component, so as to avoid high frequency components in the connection line for power supply. However, if the diameter is decreased, the amount of the current is limited, while if the length is increased, the miniaturization is difficult.

SUMMARY OF THE INVENTION

An object of the present invention is to provide a compact high frequency ceramic multi-layer substrate.

Another object of the present invention is to provide a high frequency ceramic multi-layer substrate of higher performance at high frequencies.

In one aspect of a high frequency ceramic multi-layer substrate of the present invention, a stripline is embedded between two dielectric layers and interposed between first and second ground electrodes provided at the bottom and at the top of the layers. An electric circuit such as a direct current bias circuit is formed on a third dielectric layer formed on the second ground electrode. Via holes are provided for connecting the stripline to the electric circuit through the second ground electrode. The length of the electrical conduction line through the via holes from a connection point of the stripline to a connection point to the electric circuit is a fourth of the used wavelength whereby the high frequency attenuation characteristics can be realized.

In another aspect of a high frequency ceramic multi-layer substrate of the present invention, a stripline is embedded between two dielectric layers and interposed between first and second ground electrodes provided at the bottom and at the top of the dielectric layers. A third electrode is formed on a third dielectric layer formed on the second ground electrode, and an electric circuit such as a direct current bias circuit is formed on a fourth dielectric layer formed on a third electrode and the third dielectric layer. An electrostatic capacitance is generated between the second ground electrode and the third electrode. The stripline, the electrostatic capacitance circuit and a component such as an inductor of the electric circuit section are connected electrically through via holes formed through the relevant dielectric layers isolated from the second ground electrode.

An advantage of the present invention is that improved high frequency characteristics can be realized.

Another advantage of the present invention is that a complicated circuit can be integrated compactly.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
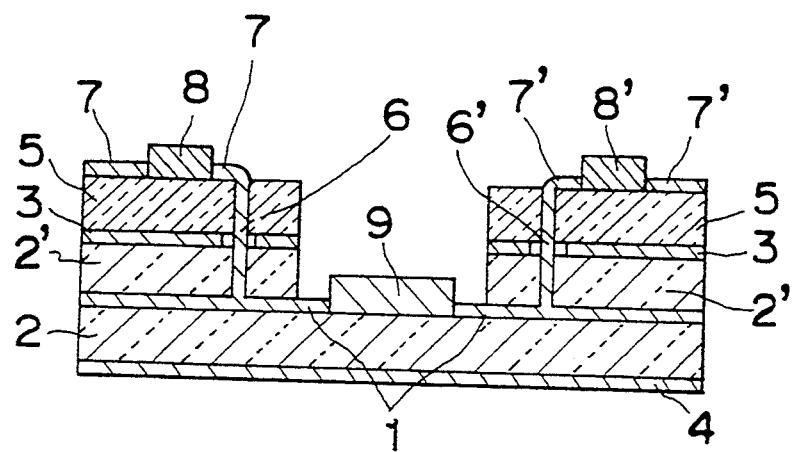
FIG. 1 is a schematic sectional view of a high frequency ceramic multi-layer substrate of a first embodiment of the present invention.

Referring now to the drawings, embodiments of the present invention will be explained below.

Embodiment 1

Figure 2:
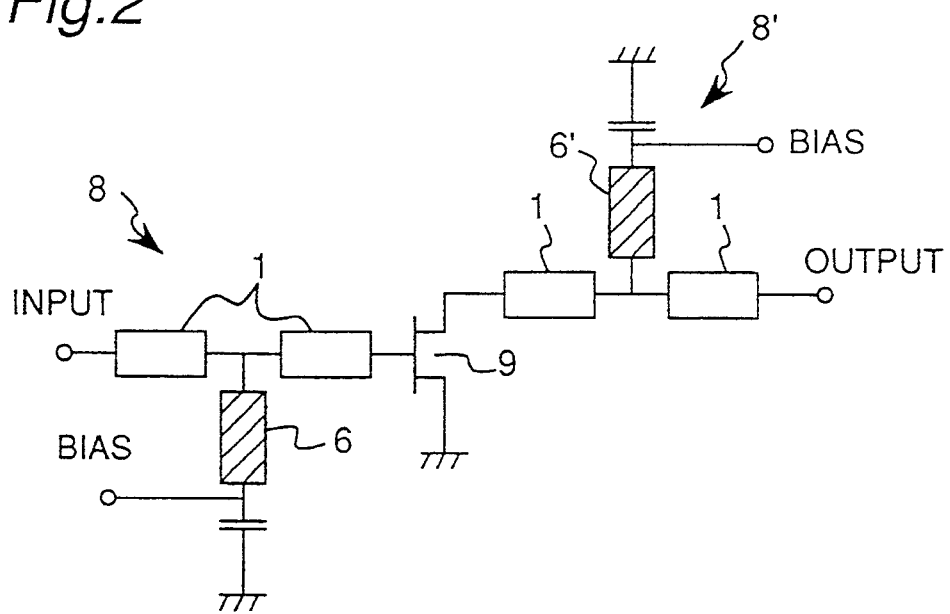
FIG. 2 is a circuit diagram of the multi-layer substrate shown in FIG. 1.

FIG. 1 is a schematic sectional view of a high frequency ceramic multi-layer substrate of Embodiment 1, while FIG. 2 is a circuit diagram of the multi-layer substrate. In FIG. 1, a stripline 1 is embedded between first and second dielectric layers 2, 2' both made of the same dielectric material. A top ground electrode 3 is a ground electrode provided on the top surface of the second dielectric layer 2' above the stripline 1, while a bottom ground electrode 4 is a ground electrode provided at the bottom surface of the first dielectric layer 2 below the stripline 1. Further, a third dielectric layer 5 made of a dielectric material is provided on the top ground electrode 3.

The second and third dielectric layers 2', 5 and the top ground electrode 3 have a gap for exposing the stripline 1 midway along the stripline 1 on the first dielectric layer 2, and a high frequency circuit made from discrete electronics components can be provided above the exposed portion of the first dielectric layer 2. In this embodiment, the high frequency circuit is made from a field effect transistor 9 and it is connected to the stripline 1, as will be explained below with reference to FIG. 2.

Via holes 6, 6' are provided through the second and third dielectric layers 2', 5 vertically through the top ground electrode 3 which is formed except around the via hole 6, 6', and electrical conductive lines are provided in the via holes 6, 6'. At the top surface of the third dielectric layer 5 is provided direct current bias circuits 8, 8' composed of discrete components including by-pass capacitors and providing various electric voltages to the transistor 9 provided in the exposed section. A terminal of the by-pass capacitor in each direct current bias circuit 8, 8' is connected to the ground, while the other is connected to the stripline 1 through a part of the electrical conduction line 7, 7' for the electric circuit 8, 8' and the via hole 6, 6'.

The effective length of the electrical conduction line from the connection point with the stripline 1 through the via hole 6, 6' to the by-pass capacitor is designed to be a fourth of the wavelength of high frequency input signals supplied to the stripline 1. For example, for high frequency signals of 25 GHz, the wavelength in air is 1.2 cm. If the dielectric layers 2, 2' is made of a dielectric material of alumina having a dielectric constant of about 9, the wavelength in the alumina (dielectric material) decreases by (dielectric constant)$^{-\frac{1}{2}}$, or to about a third of the dielectric constant in air, or 0.4 cm. Then, the $\frac{1}{4}$ wavelength becomes 0.4/4=0.1 cm (1000 μm). The actual sizes used for signal frequencies of 25 GHz are as follows: The thickness of the second dielectric layer 2' between the stripline 1 and the top ground electrode 3 is 850 μm, that of the third dielectric layer 5 is 40 μm, and that of the top ground electrode 3 is 10 μm. Therefore, the length of the via hole 6, 6' is 900 μm. The length of the electrical conduction line from the via holes 6, 6' to the by-pass capacitor is 100 μm. By using these sizes, the length of the connection line from the connection point with the strip line 1 to the by-pass capacitor is 1000 μm. That is, the by-pass capacitors are connected to the ground almost equivalently with a length of a fourth of the wavelength for high frequency signals of 25 GHz. Actually, the effective dielectric constant varies with the size of the via hole 6, 6', and with the pattern of the conductive line of the direct current bias circuit 8, 8'. However, the effective dielectric constant is found to change only a little.

Therefore, if viewed from the connection point of the stripline 1 toward the via hole 6, 6', this structure corresponds to the connection to an open end electrically, and the impedance becomes very high for high frequency signals transmitting the stripline 1. Therefore, high frequency signals can be prevented from leaking through the via hole 6, 6' to the direct current bias circuit 8, 8'. Thus, by supplying a direct current bias voltage to the transistor 9, an electric power can be supplied without adverse effects on the high frequency circuit including the transistor 9. By adopting this structure, detouring of high frequencies can be prevented, and the high frequency characteristics of the ceramic substrate can be improved.

FIG. 2 shows a diagram of the circuit of the multi-layer substrate shown in FIG. 1. The direct current bias circuit 8 supplies an input signal as a gate voltage with a bias voltage to a field effect transistor 9, while the direct current bias circuit 8' supplies a bias voltage (power supply voltage) and sends an output signal through the stripline 1. The two bias voltages are connected to the ground through the by-pass capacitors of the direct current bias circuits 8, 8'. Rectangles represent impedances of the relevant components denoted with the reference numerals. That is, rectangles 1 represent impedances of the striplines 1 including the via holes, while rectangles 6, 6' with hatched lines represent impedance of the conduction lines of equivalent $\frac{1}{4}$ wavelength. A high frequency electric signal supplied for example from the left side of the stripline 1 is input to the gate of the transistor 9, which amplifies the signal, and the signal returns to the stripline 1 to be transmitted to the right side.

The above-mentioned multi-layer structure is fabricated as described below. Sheet-like plates or so-called green plates of 0.05 to 1 mm thickness are formed from the slurry of alumina with a glass component and organic materials such as a binder, with a technique such as a doctor blade. The alumina is a dielectric material having superior high frequency characteristics. Next, portions for forming the via holes 6, 6' are formed mechanically with a punch or the like. Then, an electrically conductive paste is prepared with copper oxide, the glass component and the organic components as a binder and the like. The paste is filled in the via holes 6, 6′. Further, it is also printed for metallization on the green sheets to form prescribed patterns of electrodes, conductive lines, a stripline and the like. The green sheets thus prepared are layered successively in the prescribed order, and they are fired at 850°–1000° C. in a reduction environment sufficient to reduce the copper oxide to copper. Then, the above-mentioned structure shown in FIG. 1 is obtained. The exposed part for the stripline 1 can be realized by preparing green sheets with a space prescribed for the exposed part and by layering them. Then, discrete electronics components for the circuits 8, 8′, 9 at the top of the third dielectric layer 5 and in the space are set at necessary points, and a high frequency ceramic multi-layer substrate is completed.

Because copper is prepared for the electrodes, the conductive lines and the like have a very low electrical resistance, and the resistance loss due to electrode resistance, which is a problem previously in a high frequency circuit, can be made very low. This is very advantageous especially for a high frequency ceramic multi-layer substrate. If copper is sintered at more than 1000° C., it may react with or diffuse to the neighboring dielectric material. Therefore, it is necessary to sinter at 1000° C. or less. An increase in the amount of the glass component is found to decrease the sintering temperature.

Silver may be used instead of copper. In this case, a silver paste of silver powders mixed with glass and organic paste is prepared and sintered. Further, a reduction environment is not needed for a silver paste.

Embodiment 2

Figure 3:
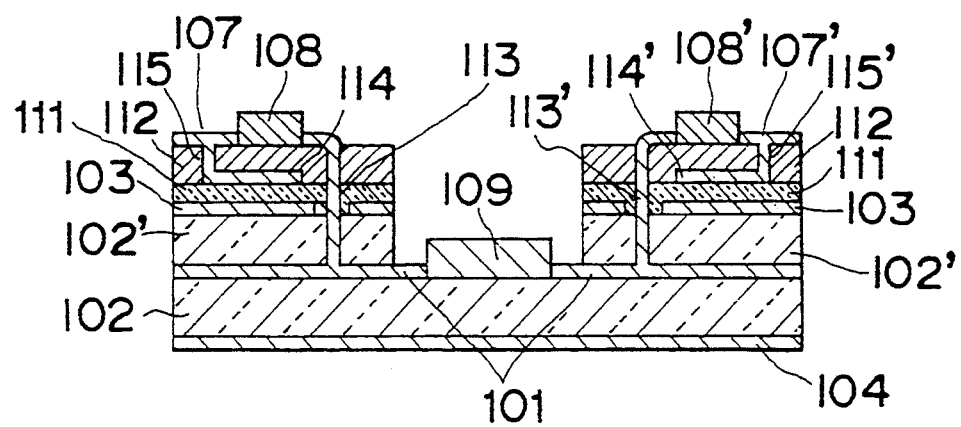
FIG. 3 is a schematic sectional view of a high frequency ceramic multi-layer substrate of a second embodiment of the present invention.
Figure 4:
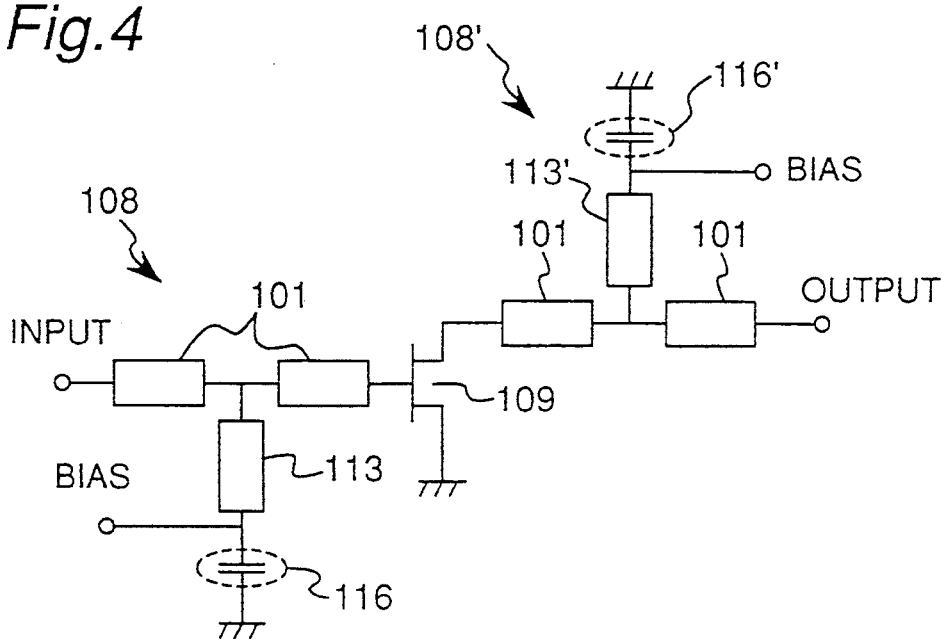
FIG. 4 is a circuit diagram of the multi-layer substrate shown in FIG. 3.

FIG. 3 shows an example of a structure of a high frequency ceramic multi-layer substrate of a second embodiment, while FIG. 4 shows a diagram of the circuit of the multi-layer structure. In FIG. 3, reference numerals 101–104 and 109 correspond to those 1–4 and 9 shown in FIG. 1. Reference numeral 101 denotes a stripline, reference numerals 102,102′ denote first and second dielectric layers made from the same dielectric material and embedding the stripline 101, reference numeral 103 denotes a top ground electrode provided on the second dielectric layer 102′, reference numeral 104 denotes a bottom ground electrode provided on the bottom surface of the first dielectric layer 102. A high frequency circuit made from discrete electronics components can be provided above the exposed portion of the first dielectric layer 2. In this embodiment, the high frequency circuit is made from a field effect transistor 109 and it is connected to the stripline 101, as will be explained below with reference to FIG. 4. A high frequency electric signal supplied for example from the left side of the stripline 101 is input to the transistor 109, and returns to the stripline 101 and is transmitted to the right side of this drawing.

A third dielectric layer 111 made from a dielectric material of a dielectric constant larger than that of the dielectric layers 102, 102′ is applied to the top ground electrode 103, and a fourth dielectric layer 112 made from the dielectric materials of the first and second dielectric layers 102,102′ is applied to the third dielectric layer 111. Via holes 113,113′ are provided through the three dielectric layers 102′, 111 and 112 vertically through the top ground electrode 103, and the top ground electrode 103 is formed except around the via hole 113, 113′. At the top surface of the fourth dielectric layer 112 are provided direct current bias circuits 108, 108′ composed of discrete components including inductors, and the inductors are connected to electrical conduction lines 107,107′ for the direct current bias circuit and provides various electric voltages to the transistor 109. The input and output sides of the stripline 101 are connected electrically with the via hole 113, 113′ to the electric circuits 108, 108′ at the top surface. Via holes 115, 115′ are also provided through the fourth dielectric layer 112. Electrodes 114, 114′ are provided opposed to the ground electrode 103 via the third dielectric layer 111, and they are connected through the via holes 115, 115′ to the conductive lines 107, 107 provided at the top surface. The via holes 115, 115′ are provided for connecting the stripline 1 through the inductors of the direct current bias circuit 108, 108′ to the electrode 114, 114′. Conductive lines are provided in the via holes 113, 113′ and 115, 115′ and on the top surface of the fourth dielectric layer 112 between the via holes 113, 113′ and 115, 115′ and they connect electrically with the stripline 101, extends up to the top surface of the fourth dielectric layer 112 through the inductor of the direct current bias circuit 108,108′ to the electrode 114,114′ for the capacitance. A part on the fourth dielectric layer 112 consists of a part of the electrical conduction lines 107, 107′ of the direct current bias circuit.

FIG. 4 shows a diagram of the circuit of the multi-layer substrate shown in FIG. 3. The direct current bias circuit 108 supplies an input signal as a gate voltage with a bias voltage to the field effect transistor 109, while the direct current bias circuit 108′ supplies a bias voltage (power supply voltage) and sends an output signal. The two bias voltages are connected to the ground through the by-pass capacitors 116, 116′ made from the electrodes 103 and 114, 114′. Rectangles represent impedances of the relevant components denoted with the reference numerals. That is, rectangles 101 represent impedances of the striplines 101 including the via holes, while rectangles 113,113′ represent the inductances of the via holes 113, 113′.

In this embodiment, an inductor such as a coil is included in the direct current bias circuit 108, 108′ and the inductor is connected in series to the stripline 101, while a capacitor is provided for connecting the bias circuit to the ground in order to cut off high frequency components in the bias circuit 108, 108′ almost completely.

Because the inductor is a discrete component, an inductor of large inductance can be used. Further, the electrostatic capacitance generated by the electrodes 103 and 114, 114′ can be very large because the dielectric constant of the third dielectric layer 111 is large. The dielectric layer 111 is made from a material for example of a dielectric constant of 70 in this embodiment, the thickness thereof is 5 to 50 μm, and the area of the electrodes 114, 114′ have appropriate values. Then, an electrostatic capacitance of about 100 pF may be fabricated easily. Thus, high frequency components leaked to the direct current bias circuit 108,108′ can be cut off almost completely, and bias voltages can be supplied without adverse effects to the transistor 109.

By adopting this multi-layer structure, an area required for the direct current bias circuit and the electrostatic capacitance both needing a large area can be decreased by separating the high frequency signal section from the direct current bias circuit section and the electrostatic capacitance section. Further, detouring of high frequencies can be prevented. Thus, the performance of the high frequency circuit is improved.

Preferably, the length of the conductive lines through the via holes from the connection point at the stripline to the by-pass capacitor in the direct current bias circuit is set to be a fourth of the wavelength of the high frequency used, as in Embodiment 1. Then, the conductive lines with use of the via holes play the same role as an open end for high frequencies, so that an improved high frequency attenuation or cut-off characteristic can be realized.

Next, a manufacturing method of the above-mentioned structure is explained. An inorganic material of superior high frequency characteristics having alumina and glass components as main components is used as a dielectric material for the dielectric layers 102, 102' and 112. On the other hand, the dielectric layer 111 is made from an inorganic material of a larger dielectric constant having bismuth-niobium as a main component and being able to be fired at low temperatures. Powders of these inorganic materials are mixed with organic materials such as a binder with a solvent, to generate a slurry. Then, sheet-like or green plates are formed from the slurry with a technique such as a doctor blade. The thickness of the plates of alumina glass is 0.3 to 1 mm, while that of bismuth-niobium is 6 to 60 $\mu$m.

Next, the via holes are formed mechanically with a punch or the like at prescribed portions. Then, a conductive paste prepared with copper oxide, the glass component and the organic components as a binder and the like are used as an electrically conductive paste, and it is filled in the via holes. Further, the paste is printed on the green sheets to form electrodes, electrical conduction lines, a stripline and the like of prescribed patterns. The green sheets thus prepared are layered successively in the prescribed order. The exposed part of the stripline 101 can be realized by preparing green sheets with a gap for the exposed part and by layering them. Then, they are fired at 850°–950° C. in a reduction environment to reduce the copper oxide. Then, discrete electronic components are set at necessary points to complete a high frequency ceramic multi-layer substrate of Embodiment 2 shown in FIG. 3.

Because copper is used for the electrodes, the lines and the like have a very low electrical resistance, so that the resistance loss due to electrode resistance which is a problem in a high frequency circuit can be made very low, and it is very advantageous especially for a high frequency ceramic multi-layer substrate. If copper is sintered at more than 1000° C. it may react with or diffuse to the neighboring dielectric material. Therefore, it is necessary to sinter at 1000° C. or less. Thus, it is found that the mixture of alumina and glass and the bismuth-niobium material are good. Silver may be used instead of copper. In this case, a silver paste of silver powders mixed with glass and organic paste is prepared and sintered. Further, a reduction environment is not needed for a silver paste.

Embodiment 3

Figure 5:
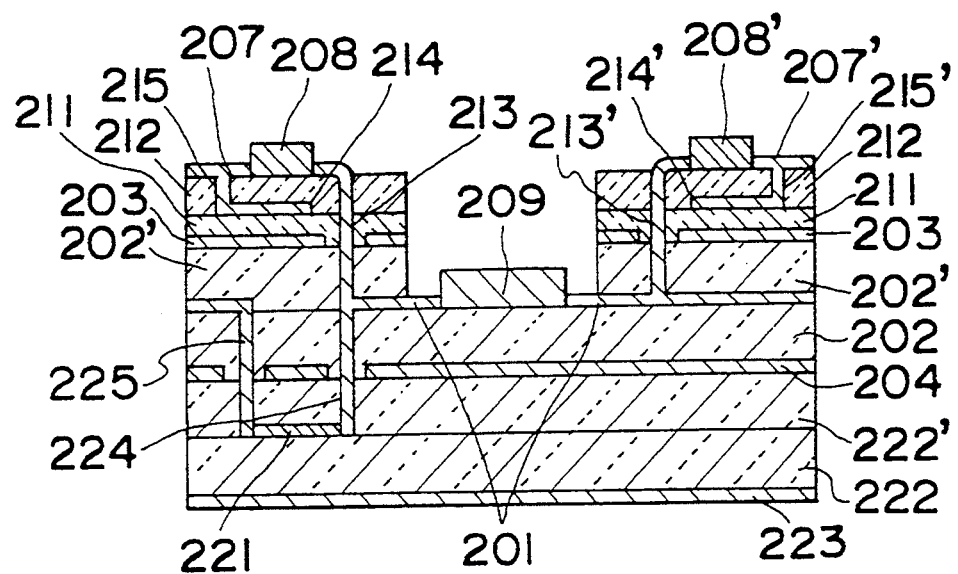
FIG. 5 is a schematic sectional view of a high frequency ceramic multi-layer substrate of a third embodiment of the present invention.
Figure 6:
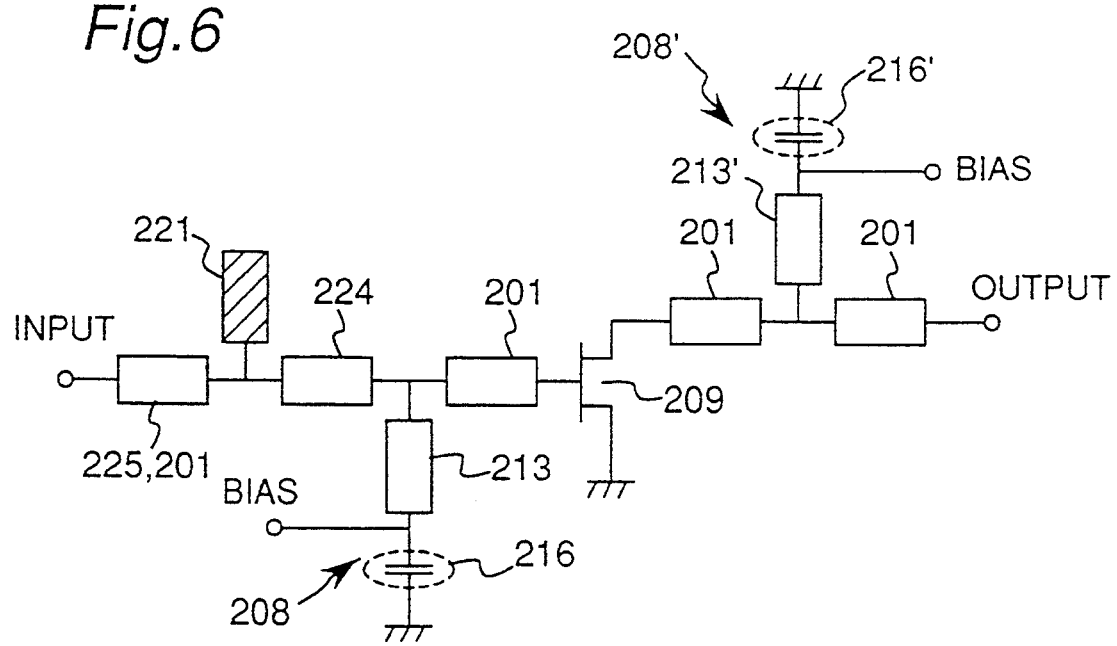
FIG. 6 is a circuit diagram of the multi-layer substrate shown in FIG. 5.

FIG. 5 shows another example of the structure of a high frequency ceramic multi-layer substrate, while FIG. 6 shows a diagram of the circuit of the multi-layer structure. In FIG. 5, reference numerals 201 to 215' denote the same parts and functions as those 101 to 115' in Embodiment 2. Differences between this structure and that of Embodiment 2 are explained below. The stripline 201 is divided to two parts in the left part of the multi-layer substrate. Reference numeral 222' denotes a fifth dielectric layer applied to the first ground electrode 204, reference numeral 221 denotes a second stripline formed on the fifth dielectric line, reference numeral 222 denotes a sixth dielectric layer applied to the second stripline 221, and reference numeral 223 denotes a third ground electrode provided at the bottom surface of the sixth dielectric layer 222. Reference numerals 224 and 225 denote via holes for connecting striplines 201 and 221 electrically isolated from the first ground electrode 204. The second stripline 221 is connected via the via holes 224, 225 to the two parts of the stripline 201 in the left side of this multi-layer substrate. The path for the high frequency electric signals and the functions of the components 201–215' are the same as in Embodiment 2. An open stub or the like for impedance matching can be connected to the second stripline 221, so that impedance matching becomes possible in the multi-layer structure without increasing the area of the substrate.

FIG. 6 shows a diagram of the circuit of the multi-layer substrate shown in FIG. 5. The direct current bias circuit 208 supplies an input signal as a gate voltage with a bias voltage to a field effect transistor 209, while the other direct current bias circuit 208' supplies a bias voltage (power supply voltage) and sends an output signal. The two bias voltages are connected to the ground through the by-pass capacitors 216, 216' made from electrodes 203 and 214, 214'. Rectangles represent impedances of the relevant components denoted with the reference numerals. That is, rectangles 201 denote impedances of the striplines 201 including the via holes, while rectangles 221 denote the second stripline for impedance matching.

Though a fabrication method of Embodiment 4 is not mentioned, a method similar to Embodiment 2 can be adopted.

Similarly, a second stripline may be added also similarly to the structure shown in FIG. 1. That is, fifth and sixth dielectric layers and a third ground electrode are applied successively to the first ground electrode 4 shown in FIG. 1, and the second stripline is embedded between the fifth and sixth dielectric layers. The second stripline is connected to the stripline 1 similarly to in FIG. 5. An open stub or the like for impedance matching can be connected to the second stripline.

Embodiment 4

Figure 7:
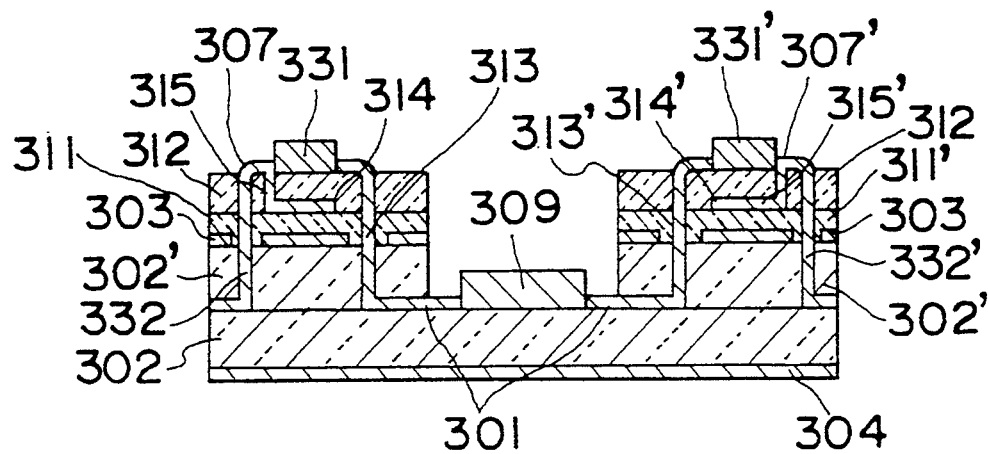
FIG. 7 is a schematic sectional view of a high frequency ceramic multi-layer substrate of a fourth embodiment of the present invention.
Figure 8:
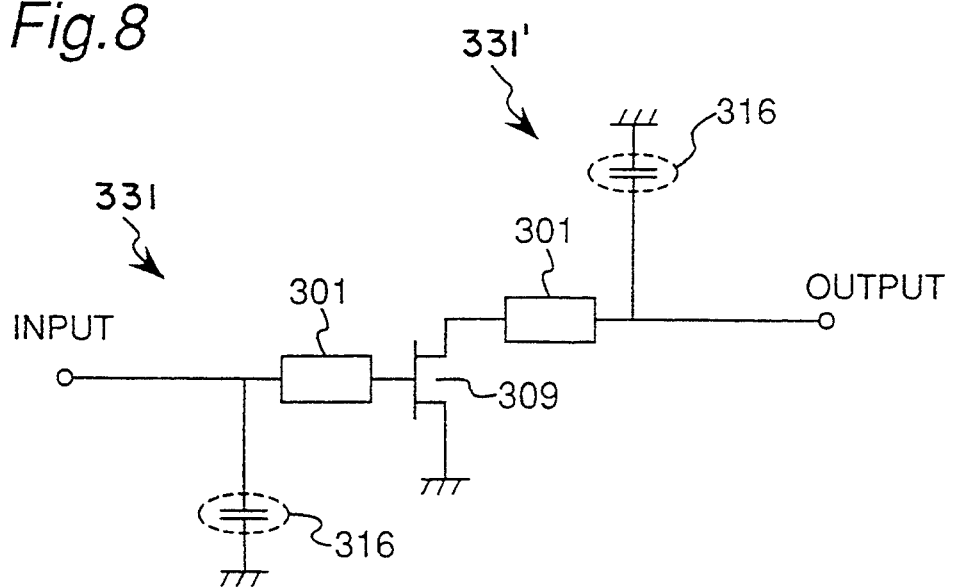
FIG. 8 is a circuit diagram of the multi-layer substrate shown in FIG. 7.

FIG. 7 shows another example of the structure of a high frequency ceramic multi-layer substrate of the present embodiment, while FIG. 8 shows a diagram of the circuit of the multi-layer structure. In FIG. 7, reference numerals 301 to 315' denote the same parts and functions as 101 to 115' in Embodiment 2. Reference numerals 331, 331' denote impedance matching circuits connected to the stripline 301. The impedance matching circuit 331, 331' control the impedance matching of the input and output of a field effect transistor 309 as a discrete electronic component provided at the exposed part. Reference numerals 332, 332' denote via holes provided through the second, third and fourth dielectric layers 302', 311 and 312 isolated from the first ground electrode 303. The stripline 301 is divided into two parts in the left and right sides of the substrate, and the two parts are connected to the impedance matching circuit 331, 331' through the via holes 332, 332' and 313, 313'. As in Embodiment 2, a high frequency electric signal supplied for example from the left side of the stripline 301 is input to the impedance matching circuit 331 via the via hole 332, and it is supplied through the other via hole 313 to the field effect transistor 309. Then, it propagates from the stripline 301 to the impedance matching circuit 331' through the via hole 313' and returns through the via hole 332' to the stripline 301 to be transmitted to the right side of this drawing.

FIG. 8 shows a diagram of the circuit of the multi-layer substrate shown in FIG. 7. The impedance matching circuit 331 sends an input signal to the gate of the field effect transistor 309, while the other impedance matching circuit 331' sends an output signal. The two bias voltages are connected to the ground through the capacitors 316, 316' for impedance matching made from electrodes 303 and 314,314'. Rectangles represent impedances of the relevant components denoted with the reference numerals. That is, rectangles 301 denote impedances of the striplines 301 including the via holes.

It is often effective to insert a capacitor against the ground in the impedance matching, and in this embodiment, the capacitor 316, 316' plays this role. Therefore, the impedance matching can be performed in a wide range. Further, because the stripline, the impedance matching circuit and electrostatic capacitance circuit such as a capacitor can be provided each in different layers, high frequency characteristics are not degraded. Further, the area of the substrate can be reduced, so that the size of the substrate can be decreased largely.

Though a fabrication method of Embodiment 4 is not mentioned, a method similar to Embodiment 2 can be adopted.

In Embodiment 4, it is clear that the circuit can be made more compact and that the performance at high frequencies can be improved, as in Embodiment 3.

In Embodiment 4, the striplines are provided in two layers. However, the number of layers for embedding striplines can be increased to three or more to make a complicated circuit more compact.

Further, in any of the Embodiments, a dielectric layer is formed only in the side of one of the ground electrodes of the stripline, and an impedance matching circuit or a direct current bias circuit is formed at the top of the dielectric layer. However, such a circuit may be formed at both sides of the substrate. If the number of electronic components is large, they may be put on the two sides of the substrate, and this makes the integrated circuit more compact.

Further, if the dielectric constant of the dielectric material used for the dielectric layers of high dielectric constant is 20 or more, it can contribute to compactness because the dielectric constant of the alumina and glass system is 10 or less.

Further, though only a capacitor connected to the ground is illustrated as an electrostatic capacitance circuit, it is possible to form a high frequency filter circuit with a capacitor.

The present invention having the above-mentioned structures, provides the following advantages:

As explained above, high frequency ceramic multi-layer substrates according to the present invention comprise a stripline embedded in a first dielectric material having ground electrodes at the top and at the bottom thereof. An electric circuit section is formed separately on a dielectric layer formed on at least one of the ground electrodes by using via holes for connecting the electric circuit to the ground electrode. Therefore, this structure is effective for decreasing the size of the integrated circuit, and it improves the high frequency characteristics because the detouring of high frequency signals to the electric circuit can be prevented.

By adopting a multi-layer structure, a high frequency circuit section for handling various high frequency components with a stripline is separated from an electric circuit such as a direct current bias circuit or an impedance matching circuit needing to equip discrete electronic components, and from an electrostatic capacitance circuit which needs an especially large area. Thus, the multi-layer structure is effective for decreasing the size of the integrated circuit. It also improves the high frequency characteristics because the detouring of high frequency signals to the direct current circuit can be prevented.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A high frequency ceramic multi-layer substrate comprising:
    a first dielectric layer made of a first dielectric material;
    a first ground electrode being formed on a surface of the first dielectric layer;
    a stripline formed on a surface of the first dielectric layer different from the other surface in contact with the first ground electrode;
    a second dielectric layer made of the first dielectric material, which second dielectric layer being layered on the first dielectric layer interposing said stripline between them;
    a second ground electrode being formed on a surface of the second dielectric layer different from the other surface in contact with the second dielectric layer;
    a third dielectric layer made of a second dielectric material, which third dielectric layer being applied to the second ground electrode;
    an electric circuit provided on the third dielectric layer; and
    an electrically conductive line extending through the second and third dielectric layers from a connection point with the stripline to a connection point with the electric circuit without electrical contact with the second ground electrodes, the equivalent length of the electrically conductive line from the connection point with the stripline to the electric circuit being a fourth of the wavelength of a signal to be input through the stripline, whereby the length of the electrically conductive line results in high frequency attenuation characteristics;
    wherein said electric circuit is made from discrete electronics components; and
    wherein said electric circuit is a direct current bias circuit and one of said discrete electronics components being connected to said electrically conductive line is a capacitor.

2. A high frequency ceramic multi-layer substrate comprising:
    a first dielectric layer made of a first dielectric material;
    a first ground electrode being formed on a surface of the first dielectric layer;

a stripline formed on a surface of the first dielectric layer different from the other surface in contact with the first ground electrode;

a second dielectric layer made of the first dielectric material, which second dielectric layer being layered on the first dielectric layer interposing said stripline between them;

a second ground electrode being formed on a surface of the second dielectric layer different from the other surface in contact with the second dielectric layer;

a third dielectric layer made of a second dielectric material, which third dielectric layer being applied to the second ground electrode;

an electric circuit provided on the third dielectric layer; and an electrically conductive line extending through the second and third dielectric layers from a connection point with the stripline to a connection point with the electric circuit without electrical contact with the second ground electrode, the equivalent length of the electrically conductive line from the connection point with the stripline to the electric circuit being a fourth of the wavelength of a signal to be input through the stripline, whereby the length of the electrically conductive line results in high frequency attenuation characteristics;

further comprising a space of said second and third dielectric layers and said second ground electrode provided above said first dielectric layer to expose a part of said stripline; and a high frequency electric circuit arranged at the exposed surface of said first dielectric layer and connected to said stripline.

3. The high frequency ceramic multi-layer substrate according to claim 2, wherein said high frequency electric circuit is made from discrete electronics components.

4. The high frequency ceramic multi-layer substrate according to claim 3, wherein said high frequency electric circuit includes a transistor connected to said stripline.

5. A high frequency ceramic multi-layer substrate further comprising:

a first dielectric layer made of a first dielectric material;

a first ground electrode being formed on a surface of the first dielectric layer;

a stripline formed on a surface of the first dielectric layer different from the other surface in contact with the first ground electrode;

a second dielectric layer made of the first dielectric material, which second dielectric layer being layered on the first dielectric layer interposing said stripline between them;

a second ground electrode being formed on a surface of the second dielectric layer different from the other surface in contact with the second dielectric layer;

a third dielectric layer made of a second dielectric material, which third dielectric layer being applied to the second ground electrode;

an electric circuit provided on the third dielectric layer;

an electrically conductive line extending through the second and third dielectric layers from a connection point with the stripline to a connection point with the electric circuit without electrical contact with the second ground electrode, the equivalent length of the electrically conductive line from the connection point with the stripline to the electric circuit being a fourth of the wavelength of a signal to be input through the stripline, whereby the length of the electrically conductive line results in high frequency attenuation characteristics;

a fourth dielectric layer applied to said first ground electrode;

a second stripline formed on the fourth dielectric layer; and a fifth dielectric layer applied to the second stripline and the fourth dielectric layer;

wherein said stripline interposed between said first and second dielectric layers consists of two parts separated from each other and electrically conductive lines isolated electrically from the first ground electrode connect the second stripline through the fourth dielectric layer in series to the two parts of said stripline.

6. The high frequency ceramic multi-layer substrate according to claim 5, wherein said second stripline is connected to an open stub for impedance matching.

7. A high frequency ceramic multi-layer substrate comprising:

a first dielectric layer made of a first dielectric material;

a first ground electrode being formed on a surface of the first dielectric layer;

a stripline formed on a surface of the first dielectric layer different from the other surface in contact with the first ground electrode;

a second dielectric layer made of the first dielectric material, which second dielectric layer being layered on the first dielectric layer interposing said stripline between the two dielectric layers;

a second ground electrode being formed on a surface of the second dielectric layer different from the other surface in contact with the first dielectric layer;

a third dielectric layer made of a second dielectric material, which third dielectric layer being applied to the second ground electrode;

a third electrode formed on the third dielectric layer to generate an electrostatic capacitance between the third electrode and the second ground electrode;

a fourth dielectric layer made of a third dielectric material, which fourth dielectric layer being applied to the third electrode and the third dielectric layer;

an electric circuit provided on the fourth dielectric layer;

a first electrically conductive line extending through the second, third and fourth dielectric layers from a connection point with the stripline without electrical contact with the second ground electrode to a connection point with the electric circuit; and a second electrically conductive line extending between a connection point with the electric circuit to a connection point with the third electrode.

8. The high frequency ceramic multi-layer substrate according to claim 7, wherein said first to fourth dielectric layers are made from alumina and glass as main components and that said first and second electrically conductive lines is made of copper or silver.

9. The high frequency ceramic multi-layer substrate according to claim 7, wherein said electric circuit is made from discrete electronics components.

10. The high frequency ceramic multi-layer substrate according to claim 9, wherein said electric circuit is a direct current bias circuit and one of said discrete electronics components connected to said electrically conductive lines is a capacitor.

11. The high frequency ceramic multi-layer substrate according to claim 9, wherein said electric circuit is an impedance matching circuit and one of said discrete electronics components connected to said electrically conductive lines is an inductor.

12. The high frequency ceramic multi-layer substrate according to claim 7, further comprising a space of said second, third and fourth dielectric layers and said second ground electrode provided above said first dielectric layer to expose a part of said stripline; and a high frequency electric circuit arranged at the exposed surface of said first dielectric layer and connected to said stripline.

13. The high frequency ceramic multi-layer substrate according to claim 12, wherein said high frequency electric circuit is made from discrete electronics components.

14. The high frequency ceramic multi-layer substrate according to claim 13, wherein said high frequency electric circuit includes a transistor connected to said stripline.

15. The high frequency ceramic multi-layer substrate according to claim 7, wherein the equivalent length of the electrically conductive lines from the connection point with the stripline to the connection point with the electrical circuit being a fourth of the wavelength of a signal to be input through the stripline, whereby the equivalent length results in high frequency attenuation characteristics.

16. The high frequency ceramic multi-layer substrate according to claim 7, further comprising:
a fifth dielectric layer applied to said first ground electrode;
a second stripline formed on the fifth dielectric layer;
a sixth dielectric layer applied to the second stripline and the fifth dielectric layer;
wherein said stripline interposed between said first and second dielectric layers consists of two parts separated from each other and electrically conductive lines isolated electrically from the second ground electrode connect the second stripline through the fifth dielectric layer in series between the two parts of said stripline formed between said first and second dielectric layers.

17. The high frequency ceramic multi-layer substrate according to claim 16, wherein said second stripline is connected to an open stub for impedance matching.

18. The high frequency ceramic multi-layer substrate according to claim 7, wherein said stripline interposed between said first and second dielectric layers consists of two parts separated from each other and electrically conductive lines isolated electrically from said second ground substrate connect the two parts through said second, third and fourth dielectric layer to said electric circuit.

* * * * *